United States Patent
Kurahashi et al.

(10) Patent No.: US 8,524,601 B2
(45) Date of Patent: Sep. 3, 2013

(54) METHOD OF MANUFACTURING SEMICONDUCTOR DEVICE USING RESOLUTION ENHANCED LITHOGRAPHY ASSISTED CHEMICAL SHRINKAGE (RELACS)

(75) Inventors: Kenichiro Kurahashi, Tokyo (JP); Hidetoshi Koyama, Tokyo (JP); Kazuyuki Onoe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/334,213

(22) Filed: Dec. 22, 2011

(65) Prior Publication Data
US 2012/0208365 A1    Aug. 16, 2012

(30) Foreign Application Priority Data
Feb. 16, 2011   (JP) .................................. 2011-030987

(51) Int. Cl.
*H01L 21/302* (2006.01)

(52) U.S. Cl.
USPC ........................................................ 438/674

(58) Field of Classification Search
USPC ................ 438/696, 735, 737, 738, 761, 778, 438/674, 708, 677
See application file for complete search history.

(56) References Cited

U.S. PATENT DOCUMENTS

| 6,579,657 B1 | 6/2003 | Ishibashi et al. | |
| 2005/0062069 A1 | 3/2005 | Saito et al. | |
| 2006/0286795 A1 | 12/2006 | Yosho | |
| 2008/0138746 A1 * | 6/2008 | Kondoh et al. | 430/326 |
| 2008/0157121 A1 * | 7/2008 | Ohki | 257/194 |
| 2008/0160770 A1 * | 7/2008 | Bok | 438/703 |
| 2008/0305443 A1 * | 12/2008 | Nakamura | 430/325 |

FOREIGN PATENT DOCUMENTS

| JP | 8-148508 | 6/1996 |
| JP | 2005-093864 | 4/2005 |
| JP | 2007-005379 | 1/2007 |

OTHER PUBLICATIONS

Mitsubishi Denki Giho, "0.1 μm hole pattern forming technology "RELACS" for semiconductor", vol. 73 No. 2, Feb. 1999.

* cited by examiner

*Primary Examiner* — Charles Garber
*Assistant Examiner* — Brigitte Paterson
(74) *Attorney, Agent, or Firm* — Leydig, Voit & Mayer, Ltd.

(57) ABSTRACT

A method of manufacturing a semiconductor device includes forming an insulating film on a surface of a semiconductor layer, forming a resist on a surface of the insulating film, the resist having an opening, forming a hardened layer on an inner circumference of the resist by attaching a pattern shrinking agent to the resist, the pattern shrinking agent undergoing a cross-linking reaction with the resist, etching the insulating film using the resist and the hardened layer as masks, removing the hardened layer, and forming a metal layer on a surface of the semiconductor layer, on a surface of the insulating film, and on a surface of the resist. The method further includes removing the resist and the portion of the metal layer on the surface of the resist by lift-off.

8 Claims, 8 Drawing Sheets

METHOD OF MANUFACTURING SEMICONDUCTOR DEVICE USING RESOLUTION ENHANCED LITHOGRAPHY ASSISTED CHEMICAL SHRINKAGE (RELACS)

BACKGROUND OF THE INVENTION

1. Field of the Invention

The present invention relates to a method of manufacturing a semiconductor device having a field plate structure.

2. Background Art

Japanese Laid-Open Patent Publication No. 2005-093864 discloses a method of manufacturing a semiconductor device, which includes forming an insulating film on a portion of the surface of a semiconductor layer and then forming a metal layer continuously extending on the surface of the semiconductor layer and on the surface of the insulating film. This semiconductor device manufacturing method performs both an exposure/development step for processing the insulating film into the desired shape and an exposure/development step for processing the metal layer into the desired shape (the latter step being hereinafter referred to as the "metal film exposure step"). The portion of the metal layer overlying the semiconductor layer functions as a gate electrode, and the portion of the metal layer overlying the insulating film functions as a field plate.

In the method for forming the field plate, an opening is formed in the insulating film, and the metal layer is formed to continuously extend over the opening and on the surface of the insulating film (covering the exposed portion of the semiconductor layer at the opening). The field plate (i.e., the portion of the metal layer overlying the insulating film) should preferably be formed at a predetermined position relative to the center of the opening. It has been found, however, that the position of the field plate structure relative to the center of the opening may vary due to variations in the metal film exposure step, resulting in variations in the characteristics of the semiconductor device.

SUMMARY OF THE INVENTION

The present invention has been made to solve the above problems. It is, therefore, an object of the present invention to provide a semiconductor device manufacturing method capable of forming the field plate structure at the desired position relative to the center of the opening in the underlying insulating film without any positional variation.

According to one aspect of the present invention, a method of manufacturing a semiconductor device, includes the steps of forming an insulating film on a surface of a semiconductor layer, forming a resist on a surface of the insulating film, the resist having an opening, forming a hardened layer on an inner circumference of the resist by attaching a pattern shrinking agent to the resist, the pattern shrinking agent undergoing a cross-linking reaction with the resist, etching the insulating film using the resist and the hardened layer as masks, removing the hardened layer, forming a metal layer on a surface of the semiconductor layer, on a surface of the insulating film, and on a surface of the resist, and removing the resist and the portion of the metal layer on the surface of the resist by a lift-off technique.

Other and further objects, features and advantages of the invention will appear more fully from the following description.

DETAILED DESCRIPTION OF THE PREFERRED EMBODIMENTS

First Embodiment

Figure 1:
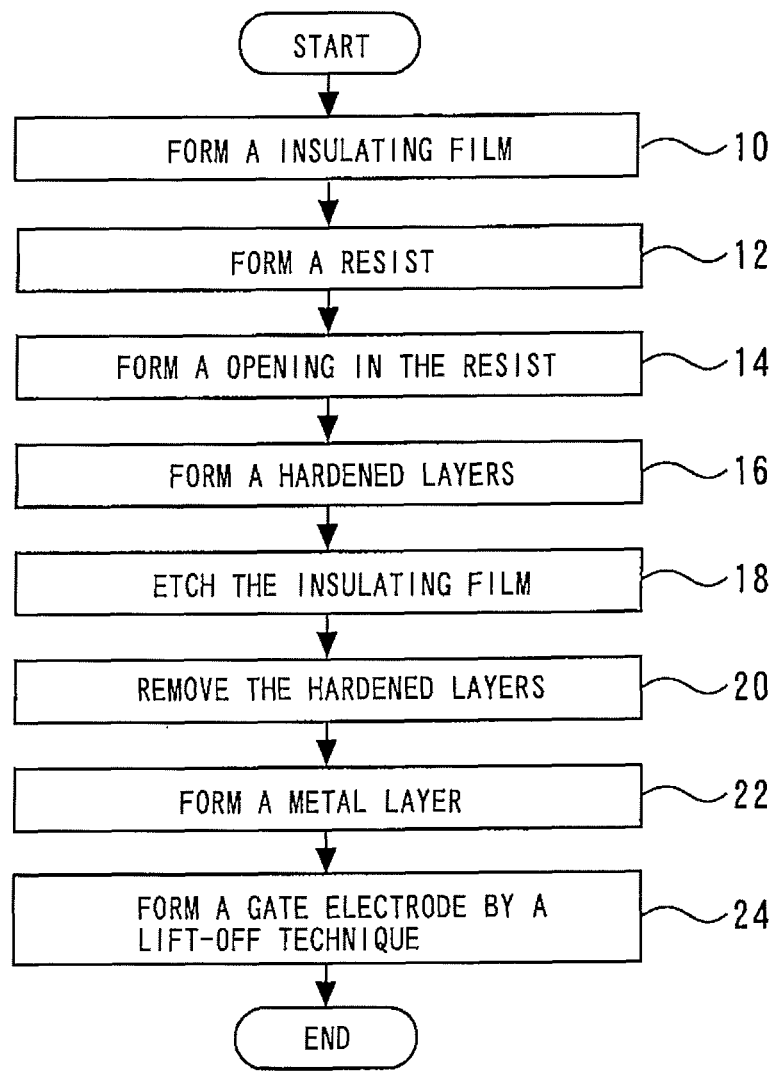
FIG. 1 is a flowchart showing a method of manufacturing a semiconductor device in accordance with a first embodiment of the present invention.
Figure 2:
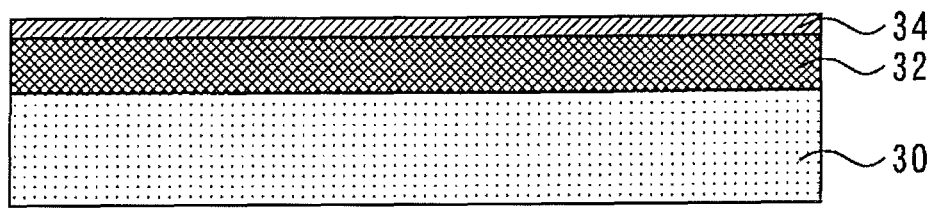
FIG. 2 is a diagram showing an insulating film formed on the surface of a semiconductor layer, which is formed on the surface of a substrate.

FIG. 1 is a flowchart showing a method of manufacturing a semiconductor device in accordance with a first embodiment of the present invention. The method of manufacturing a semiconductor device in accordance with the first embodiment will be described with reference to FIG. 1. First, an insulating film is formed on the surface of a semiconductor layer (step 10). This step 10 will be described with reference to FIG. 2. FIG. 2 is a diagram showing an insulating film 34 formed on the surface of a semiconductor layer 32, which is formed on the surface of a substrate 30. The substrate 30 is formed of SiC, and the semiconductor layer 32 is formed of GaN/AlGaN. The insulating film 34 on the surface of the semiconductor layer 32 is formed of SiN.

Figure 3:
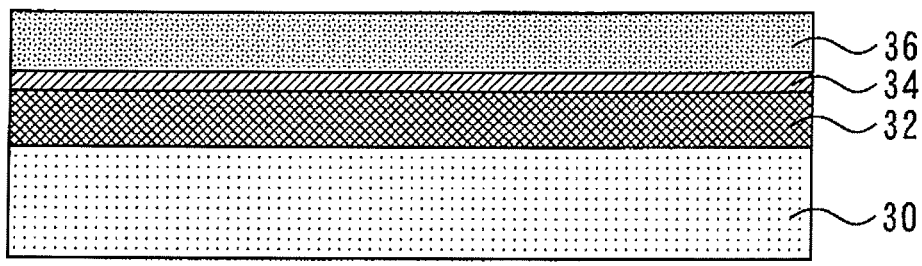
FIG. 3 is a diagram showing a resist formed on the surface of the insulating film.

Next, a resist is formed on the surface of the insulating film 34 (step 12). This step 12 will be described with reference to FIG. 3. FIG. 3 is a diagram showing a resist 36 formed on the surface of the insulating film 34. The resist 36 contains a material which becomes acidic when exposed to light.

Figure 4:
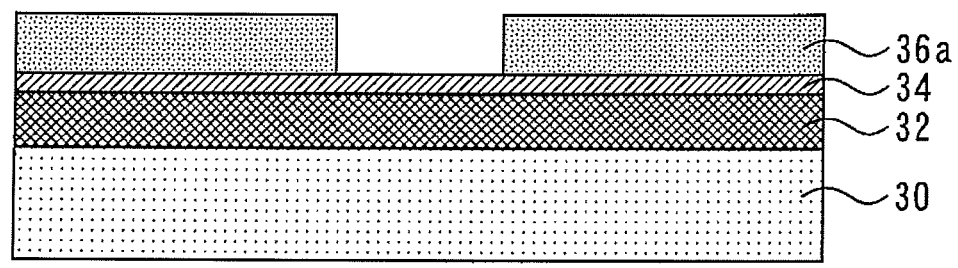
FIG. 4 is a diagram showing the opening formed in the resist.

An opening is then formed in the resist 36 (step 14). This step 14 will be described with reference to FIG. 4. FIG. 4 is a diagram showing the opening formed in the resist. Specifically, in step 14, the portion of the resist 36 where the opening is to be formed is exposed to light, and then the resist is developed, leaving an apertured, or annular, resist 36a (having the opening formed therein). It should be noted that the inner circumferential portion of the apertured resist 36a still contains some acid components, although the portion of the resist 36 that was directly exposed to light has been removed by the developing process.

Figure 5:
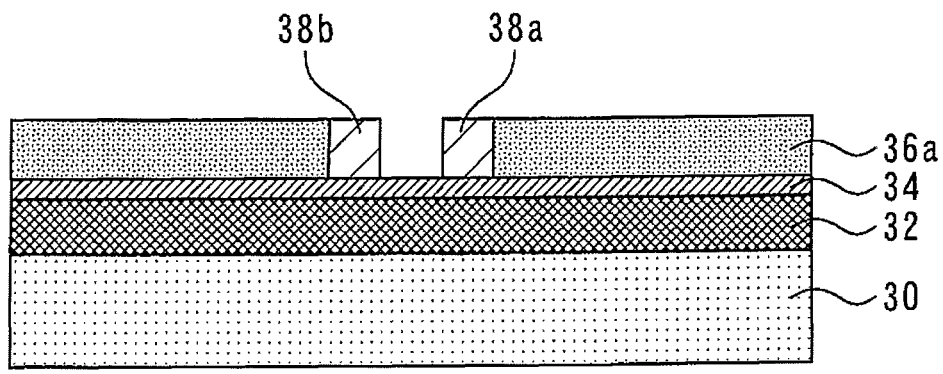
FIG. 5 is a diagram showing hardened layers formed by the RELACS process.

Next, hardened layers are formed by an RELACS (Resolution Enhanced Lithography Assisted by Chemical Shrink) process (in step 16). This step 16 will be described with reference to FIG. 5. FIG. 5 is a diagram showing hardened layers 38a and 38b formed by the RELACS process. The hardened layers 38a and 38b are formed by attaching to the inner circumference of the resist 36a a pattern shrinking agent capable of undergoing cross-linking reaction in the presence of the acid components of the resist 36a which act as catalysts. The cross-linking reaction is triggered by heat treatment. Since the hardened layers 38a and 38b are formed on the inner circumference of the resist 36a, the width of the opening at which the insulating film 34 is exposed is less than the width of the opening in the resist 36a by an amount equal to the sum of the widths of the hardened layers 38a and 38b.

Figure 6:
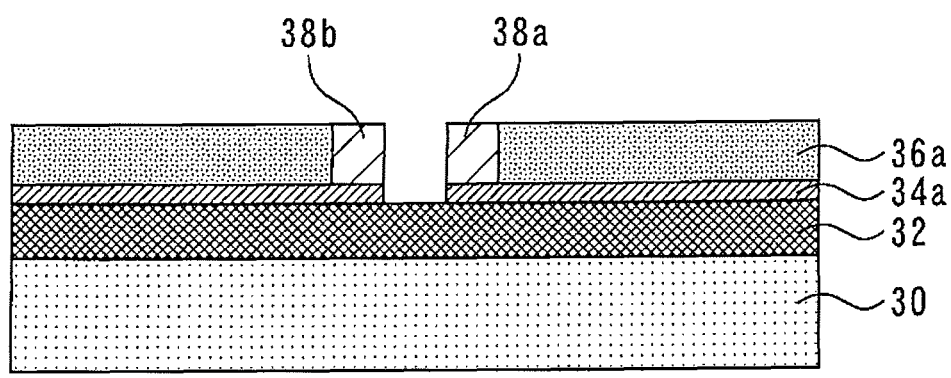
FIG. 6 is a diagram showing an apertured insulating film produced by etching the insulating film.

The insulating film 34 is then etched (step 18). This step 18 will be described with reference to FIG. 6. FIG. 6 is a diagram showing an apertured insulating film 34a produced by etching the insulating film 34. Specifically, the insulating film 34 is etched using the resist 36a and the hardened layers 38a and 38b as masks. This etching is effected by dry etching using fluorine radicals, hydrofluoric acid-based wet etching, or a combination thereof. Thus this etching forms the apertured insulating film 34a with a single opening from the insulating film 34.

Figure 7:
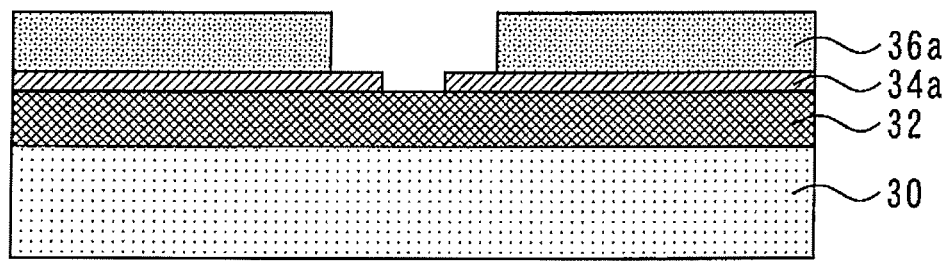
FIG. 7 is a diagram showing the device after the hardened layers have been removed.

The hardened layers are then removed (step 20). This step 20 will be described with reference to FIG. 7. FIG. 7 is a diagram showing the device after the hardened layers have been removed. This removal of the hardened layers is accomplished by use of a strong alkaline solution. As a result of the removal of the hardened layers, the portions of the apertured insulating film 34a that were under these layers are exposed to ambient atmosphere.

Figure 8:
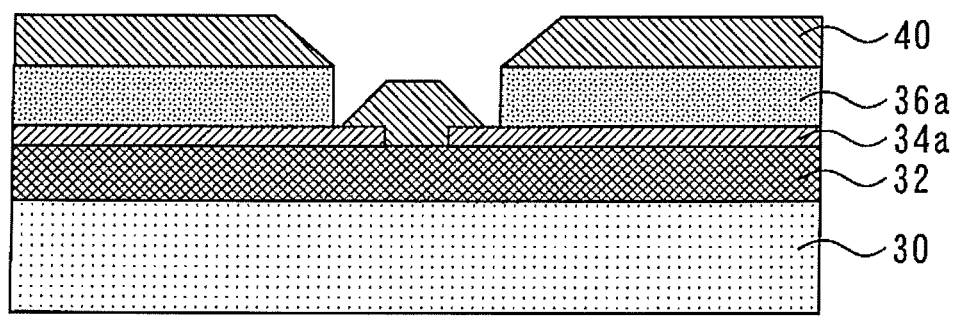
FIG. 8 is a diagram showing a formed metal layer.

A metal layer is then formed (step 22). This step 22 will be described with reference to FIG. 8. FIG. 8 is a diagram showing a formed metal layer 40. The metal layer 40 is formed on the surfaces of the semiconductor layer 32, the apertured insulating film 34a, and the resist 36a.

Figure 9:
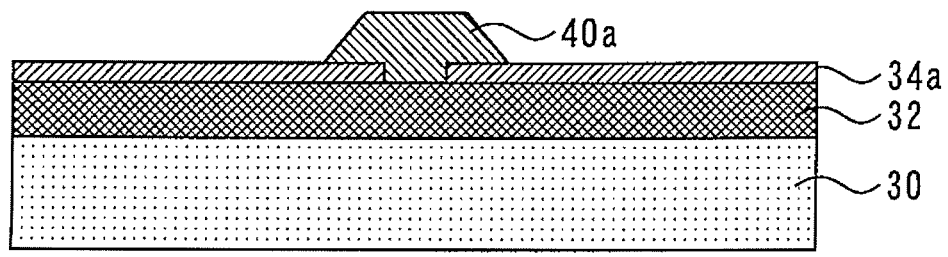
FIG. 9 is a diagram showing a gate electrode having a field plate structure formed by a lift-off technique.

A gate electrode having a field plate structure is then formed by a lift-off technique (step 24). This step 24 will be described with reference to FIG. 9. FIG. 9 is a diagram showing a gate electrode 40a having a field plate structure formed by a lift-off technique. Specifically, the resist 36a along with the metal layer formed thereon is removed by a lift-off technique, leaving behind the metal layer overlying the surfaces of the semiconductor layer 32 and the apertured insulating film 34a. This remaining metal layer constitutes the gate electrode 40a having a field plate structure. The field plate structure is formed by the portion of the metal layer left on the surface of the apertured insulating film 34a. The method of manufacturing a semiconductor device in accordance with the first embodiment includes the above steps.

In accordance with the semiconductor device manufacturing method of the first embodiment, the hardened layers 38a and 38b are formed on the inner circumference of the apertured resist 36a, thereby reducing the width of the opening at which the underlying insulating film 34 is exposed. The exposed portion of the insulating film 34 is then etched away, thereby forming the apertured insulating film 34a. The hardened layers 38a and 38b are then removed, thus increasing the width of the opening at which the apertured insulating film 34a is exposed. The gate electrode 40a having a field plate structure is then formed. This process eliminates the need for a metal film exposure step, making it possible to form the field plate structure at the desired position relative to the center of the opening in the insulating film 34a without any positional variation. Further, the manufacturing process is simplified since it does include a metal film exposure step.

Figure 10:
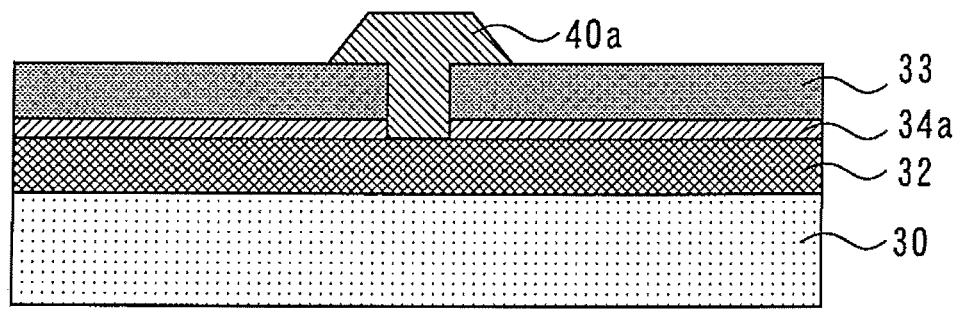
FIG. 10 is a diagram showing a method of manufacturing a semiconductor device, which method is a modification of that of the first embodiment.

FIG. 10 is a diagram showing a method of manufacturing a semiconductor device, which method is a modification of that of the first embodiment. As shown in the figure, the semiconductor device manufactured by this method includes a layered structure including the apertured insulating film 34a and an insulating film 33 of SiOx. Thus the present invention may be applied to semiconductor devices which include two or more types of insulating films layered on top of one another.

Second Embodiment

Figure 11:
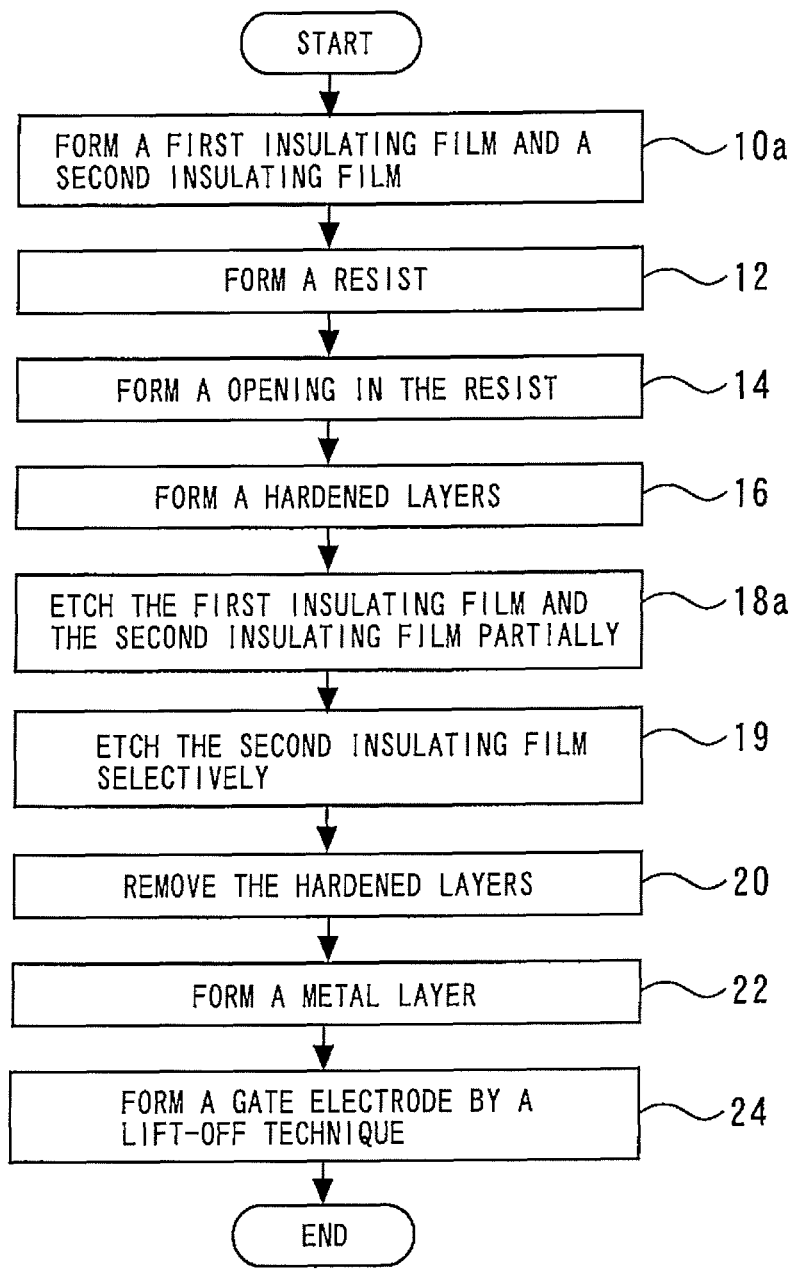
FIG. 11 is a flowchart showing a method of manufacturing a semiconductor device in accordance with a second embodiment of the present invention.

FIG. 11 is a flowchart showing a method of manufacturing a semiconductor device in accordance with a second embodiment of the present invention. In this flowchart, steps identical to those shown in FIG. 1 are labeled with the same reference numerals and will not be further described herein.

Figure 12:
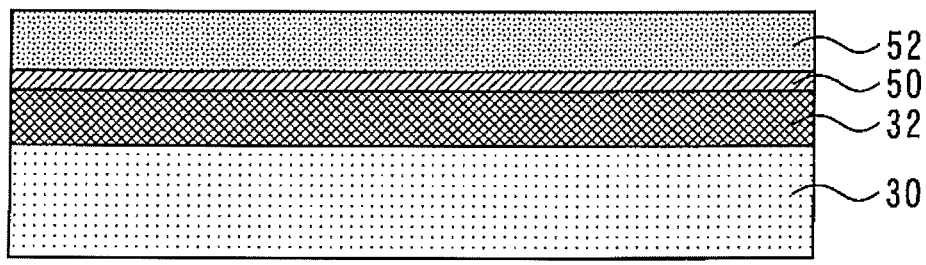
FIG. 12 is a diagram showing a first insulating film formed on the surface of the semiconductor layer, and a second insulating film formed on the surface of the first insulating film.

First, a first insulating film and a second insulating film are formed on the surface of a semiconductor layer (step 10a). This step 10a will be described with reference to FIG. 12. FIG. 12 is a diagram showing a first insulating film 50 formed on the surface of the semiconductor layer 32, and a second insulating film 52 formed on the surface of the first insulating film 50. The first insulating film 50 is formed of SiN, and the second insulating film 52 is formed of SiOx.

Figure 13:
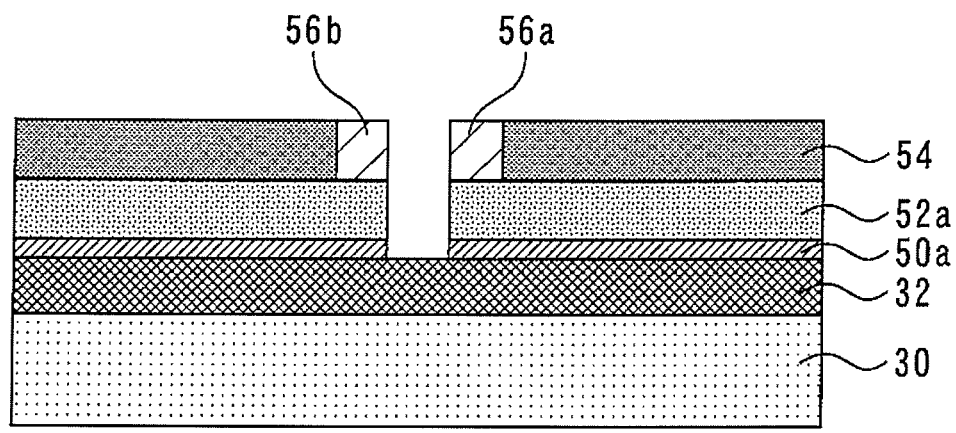
FIG. 13 is a diagram showing a first apertured insulating film with a single opening and a second apertured insulating film with a single opening, formed by etching the first and second insulating films, respectively.

Then after performing steps 12, 14, and 16, the first insulating film 50 and the second insulating film 52 are etched using a resist 54 and hardened layers 56a and 56b as masks (step 18a). This step 18a will be described with reference to FIG. 13. FIG. 13 is a diagram showing a first apertured insulating film 50a with a single opening and a second apertured insulating film 52a with a single opening, formed by etching the first and second insulating films 50 and 52, respectively. (The first apertured insulating film 50a and the second apertured insulating film 52a are hereinafter referred to simply as the first insulating film 50a and the second insulating film 52a, respectively.)

Figure 14:
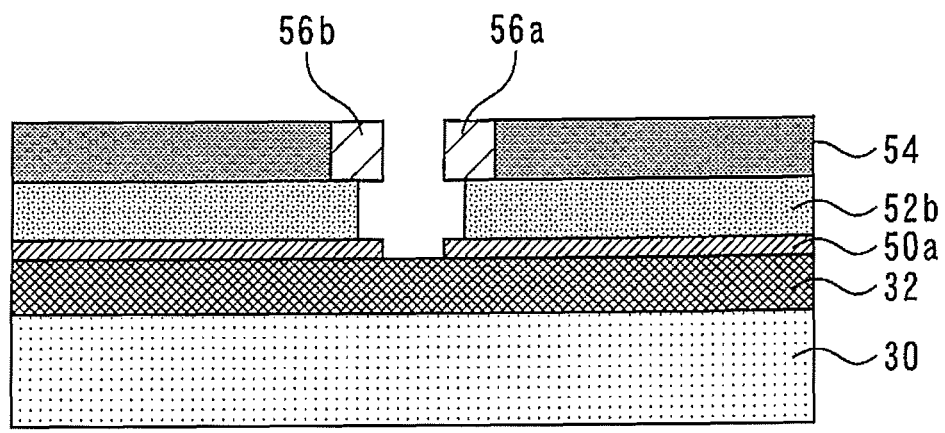
FIG. 14 is a diagram showing the device after the second insulating film has been selectively etched.

Next, the second insulating film 52a is selectively etched (step 19). This step 19 will be described with reference to FIG. 14. FIG. 14 is a diagram showing the device after the second insulating film 52a has been selectively etched. (It should be noted that the remaining second insulating film is referred to herein as a second insulating film 52b.) This etching of the second insulating film 52a is effected by dry etching using fluorine radicals, hydrofluoric acid-based wet etching, or a combination thereof. As a result of this etching, the width of the opening in the resulting second insulating film 52b is greater than that of the opening in the first insulating film 50a. It should be noted that the width of the opening in the second insulating film 52b is less than that of the opening in the resist 54.

Figure 15:
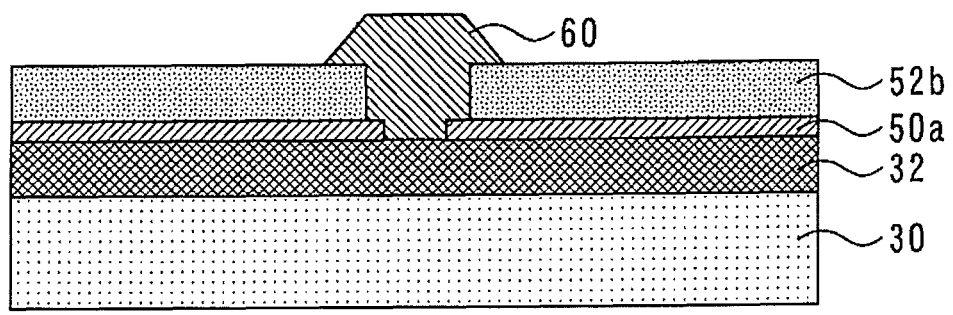
FIG. 15 is a diagram showing a gate electrode having a multiple-step field plate structure.

Next, steps 20, 22, and 24 are performed to form a gate electrode having a multiple-step field plate structure. FIG. 15 is a diagram showing a gate electrode 60 having a multiple-step field plate structure. This field plate structure has a portion overlying the first insulating film 50a and a portion overlying the second insulating film 50b, thus having a multiple step shape. Such a multiple step configuration of the field plate structure enhances the dielectric strength of the semiconductor device.

Thus in accordance with the semiconductor device manufacturing method of the second embodiment, the material of the second insulating film 52 is such that it can be selectively etched relative to the first insulating film 50, making it possible to form the gate electrode 60 having the multiple-step field plate structure. Further, since the second insulating film 52a is selectively etched, the first insulating film 50a is not subjected to etching at that time, meaning that the side etching of the gate opening in the first insulating film 50a is prevented.

The semiconductor device manufacturing method of the second embodiment is characterized by forming a multiple-step field plate structure including a plurality of types of insulating films. That is, this field plate structure may include two or more types of selectively etchable insulating films.

Further, the selective etching may be performed after removing the hardened layers. Still further, a plurality of selective etching operations may be performed to adjust the widths of the openings in the insulating films.

In accordance with the present invention, the field plate structure can be formed at the desired position relative to the center of the opening in the underlying insulating film without any positional variation, and this is accomplished without a metal film exposure step.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-030987, filed on Feb. 16, 2011 including specification, claims, drawings and summary, on which the Convention priority of the present application is based, are incorporated herein by reference in its entirety.

What is claimed is:

1. A method of manufacturing a semiconductor device, comprising:
   forming an insulating film on a surface of a semiconductor layer;
   forming a resist on a surface of said insulating film, said resist having an opening;
   forming a hardened layer in the opening and contacting an inner circumferential surface of said resist, in the opening, by attaching a pattern shrinking agent to said resist, said pattern shrinking agent undergoing a cross-linking reaction with said resist;
   etching said insulating film using said resist and said hardened layer as masks;
   removing said hardened layer without removing said resist;
   forming a metal layer on a surface of said semiconductor layer, on a surface of said insulating film, and on a surface of said resist; and
   removing said resist and the portion of said metal layer on said surface of said resist by lift-off.

2. The method according to claim 1, including:
   forming said resist of a material that becomes an acid when exposed to light;
   exposing said resist to light before forming said hardened layer;
   heat treating said pattern shrinking agent to trigger the cross-linking reaction in the presence of said acid which acts as a catalyst; and
   removing said hardened layer using an alkaline solution.

3. The method according to claim 1, wherein said insulating film includes at least two different films layered on top of one another.

4. The method according to claim 1, wherein:
   said insulating film includes at least two selectively etchable films layered on top of one another; and
   said method further comprises, before forming said metal layer, selectively etching at least one of said at least two films so that width of an opening in at least one of said at least two films is larger than widths of openings in other films of said at least two films.

5. A method of manufacturing a semiconductor device, comprising:
   forming an insulating film on a surface of a semiconductor layer;
   forming a resist on a surface of said insulating film;
   forming a first opening in said resist, the first opening having a circumferential side wall of said resist and extending to said surface of said insulating film;
   applying a pattern shrinking agent to said resist in the first opening, contacting said circumferential side wall, wherein said pattern shrinking agent undergoes a cross-linking reaction with said resist where said pattern shrinking agent is in contact with said resist at said circumferential side wall, and forms a cross-linked portion of said pattern shrinking agent adjacent and contiguous to said circumferential side wall;
   developing said pattern shrinking agent to expose said surface of said insulating film in a second opening, within and of smaller area than the first opening, and leaving said cross-linked portion in place in the first opening, thereby reducing exposed area of said surface of said insulating film, exposed through the second opening, as compared to the area of the first opening;
   etching said insulating film in the first opening and exposing part of said surface of said semiconductor layer, using said resist and said cross-linked portion as masks;
   removing said cross-linked portion of said pattern shrinking agent, without removing said resist, to expose said insulating film in the first opening, with said semiconductor layer exposed within the second opening, within the first opening;
   forming a metal layer on said surface of said semiconductor layer in the first opening, after removal of said cross-linked portion, on said insulating film in the first opening, and on said resist outside the first opening; and
   removing said resist and the portion of said metal layer on said resist by lift-off, leaving said metal layer on said surface of said semiconductor layer in the second opening and on said insulating film in the second opening, and separated from said semiconductor layer by said insulating film in part of the first opening.

6. The method according to claim 5, including:
   forming said resist of a material that forms an acid when exposed to light;
   exposing said resist to light before forming said cross-linked portion of said pattern shrinking agent;
   heat treating said pattern shrinking agent to trigger the cross-linking reaction with said resist, wherein the acid catalyzes the cross-linking reaction; and
   developing said pattern shrinking agent, after the cross-linking reaction, with an alkaline solution.

7. The method according to claim 5, wherein said insulating film includes at least two layers of different insulating materials.

8. The method according to claim 5, wherein said insulating film includes at least two layers of different insulating materials, with different, respective etching characteristics, and the method further comprises, before forming said metal layer, selectively etching and removing at least part of at least one of said layers so that an opening in one of said at least two layers is wider than openings in other layers of said at least two layers.

* * * * *